United States Patent
Fantini et al.

(10) Patent No.: US 11,152,427 B2
(45) Date of Patent: Oct. 19, 2021

(54) CHALCOGENIDE MEMORY DEVICE COMPONENTS AND COMPOSITION

(71) Applicant: Micron Technology, Inc., Boise, ID (US)

(72) Inventors: Paolo Fantini, Vimercate (IT); F. Daniel Gealy, Kuna, ID (US); Enrico Varesi, Milan (IT); Swapnil A. Lengade, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/544,506

(22) Filed: Aug. 19, 2019

(65) Prior Publication Data

US 2020/0035753 A1    Jan. 30, 2020

Related U.S. Application Data

(60) Continuation of application No. 16/184,465, filed on Nov. 8, 2018, now Pat. No. 10,439,000, which is a
(Continued)

(51) Int. Cl.
*H01L 27/24*     (2006.01)
*C01B 19/00*    (2006.01)
(Continued)

(52) U.S. Cl.
CPC ........ *H01L 27/2427* (2013.01); *C01B 19/007* (2013.01); *C01B 35/14* (2013.01);
(Continued)

(58) Field of Classification Search
CPC ... H01L 45/06; H01L 45/1233; H01L 45/141; H01L 45/143; H01L 27/2427;
(Continued)

(56) References Cited

U.S. PATENT DOCUMENTS

| | | | |
|---|---|---|---|
| 3,748,501 A | | 7/1973 | Fritzsche et al. |
| 3,877,049 A | * | 4/1975 | Buckley .............. H01L 27/2409 257/4 |

(Continued)

FOREIGN PATENT DOCUMENTS

| | | | |
|---|---|---|---|
| EP | 0196891 A1 | * 10/1986 | ......... H01L 45/1233 |
| EP | 0196891 A1 | 10/1986 | |

(Continued)

OTHER PUBLICATIONS

Adam, J-L et al. Chalcogenide glasses: preparation, properties and applications. Oct. 18, 2013.
(Continued)

*Primary Examiner* — David C Spalla
(74) *Attorney, Agent, or Firm* — Holland & Hart LLP

(57) ABSTRACT

Systems, devices, and methods related to or that employ chalcogenide memory components and compositions are described. A memory device, such as a selector device, may be made of a chalcogenide material composition. A chalcogenide material may have a composition that includes one or more elements from the boron group, such as boron, aluminum, gallium, indium, or thallium. A selector device, for instance, may have a composition of selenium, arsenic, and at least one of boron, aluminum, gallium, indium, or thallium. The selector device may also be composed of germanium or silicon, or both. The relative amount of boron, aluminum, gallium, indium, or thallium may affect a threshold voltage of a memory component, and the relative amount may be selected accordingly. A memory component may, for instance have a composition that includes selenium, arsenic, and some combination of germanium, silicon, and at least one of boron, aluminum, gallium, indium, or thallium.

16 Claims, 4 Drawing Sheets

Related U.S. Application Data division of application No. 15/466,689, filed on Mar. 22, 2017, now Pat. No. 10,163,977.

(51) Int. Cl.

| | | |
|---|---|---|
| *C01B 35/14* | (2006.01) | |
| *G11C 11/22* | (2006.01) | |
| *G11C 13/00* | (2006.01) | |
| *H01L 27/11507* | (2017.01) | |
| *H01L 27/11514* | (2017.01) | |
| *H01L 45/00* | (2006.01) | |

(52) U.S. Cl.
CPC .......... *G11C 11/22* (2013.01); *G11C 13/0004* (2013.01); *H01L 27/11507* (2013.01); *H01L 27/11514* (2013.01); *H01L 45/04* (2013.01); *H01L 45/06* (2013.01); *H01L 45/1233* (2013.01); *H01L 45/143* (2013.01); *G11C 2213/71* (2013.01); *G11C 2213/73* (2013.01); *H01L 27/2481* (2013.01)

(58) Field of Classification Search
CPC ....... H01L 2924/055; H01L 2924/0563; H01L 27/11507; H01L 27/11514; H01L 27/2463; H01L 27/2481; H01L 45/04; C01B 35/14; C01B 19/007; G11C 13/0004; G11C 2213/71; G11C 2213/73; G11C 11/22

See application file for complete search history.

(56) References Cited

U.S. PATENT DOCUMENTS

| | | | |
|---|---|---|---|
| 4,652,794 A | 3/1987 | Waite et al. | |
| 4,928,199 A | 5/1990 | Diaz et al. | |
| 7,547,652 B2 | 6/2009 | Zhang et al. | |
| 9,379,321 B1 | 6/2016 | Chang et al. | |
| 9,613,676 B1 | 4/2017 | Wang et al. | |
| 9,941,333 B2 | 4/2018 | Jeong et al. | |
| 10,163,977 B1 | 12/2018 | Fantini et al. | |
| 10,727,405 B2 | 7/2020 | Varesi et al. | |
| 2004/0208038 A1 | 10/2004 | Idehara | |
| 2005/0029505 A1* | 2/2005 | Lowrey .............. | G11C 13/0007 257/5 |
| 2007/0247899 A1* | 10/2007 | Gordon .............. | G11C 13/0004 365/163 |
| 2009/0072341 A1 | 3/2009 | Liu et al. | |
| 2009/0302293 A1 | 12/2009 | Morikawa et al. | |
| 2010/0022378 A1 | 1/2010 | Nguyen et al. | |
| 2013/0336042 A1 | 12/2013 | Lee et al. | |
| 2015/0038314 A1 | 2/2015 | Aitken et al. | |
| 2015/0048291 A1 | 2/2015 | Cheng et al. | |
| 2016/0368813 A1 | 12/2016 | Carlie | |
| 2017/0244026 A1* | 8/2017 | Wu .............. | H01L 45/126 |
| 2017/0244030 A1 | 8/2017 | Park et al. | |
| 2018/0019392 A1 | 1/2018 | Lee et al. | |
| 2018/0277601 A1 | 9/2018 | Ahn et al. | |

FOREIGN PATENT DOCUMENTS

| | | |
|---|---|---|
| JP | S36-12676 | 3/1959 |
| JP | 2001514148 A | 9/2001 |
| JP | 2011139057 A | 7/2011 |
| KR | 20100035248 A | 4/2010 |
| KR | 20110022250 A | 3/2011 |
| KR | 20130062211 A | 6/2013 |
| KR | 20160112938 A | 9/2016 |
| KR | 20160145002 A | 12/2016 |
| KR | 20180057977 A * | 5/2018 |
| KR | 20180057977 A | 5/2018 |
| KR | 20180109287 A | 10/2018 |
| WO | 2018066320 A1 | 4/2018 |
| WO | 2018200312 A1 | 11/2018 |
| WO | 2019167538 A1 | 9/2019 |

OTHER PUBLICATIONS

Intellectual Property Office of Singapore, "Written Opinion," issued in connection with Application No. 10201810518W, dated Nov. 26, 2019 (6 pages).

ISA/KR, International Search Report and Written Opinion of the International Searching Authority, Int'l Appl. No. PCT/US2019/062801, dated Mar. 16, 2020, Korean Intellectual Property Office, Seo-gu, Daejeon, Republic of Korea,11 pgs.

Japanese Patent Office, "Office Action," issued in connection with Japanese Patent Application No. 2018-218076, dated Feb. 4, 2020 (7 pages).

The Korean Intellectual Property Office, "Notice of Reasons for Rejection," issued in connection with Korean Patent Application No. 10-2018-0153658, dated Feb. 28, 2020 (12 pages).

European Patent Office, "European Search Report," issued in connection with European Patent Application No. 18209507.5, dated Mar. 6, 2019 (8 pages).

Kotkata et al., "The effect of Tl addition on the electrical and thermal transport properties of amorphous As2Se3," Semiconductor Science and Technology, vol. 1, No. 5, Nov. 1986 (7 pages).

Shiryaev et al., "Preparation of high purity glasses in the GA—Ge—As—Se system," Optical Materials, vol. 37, May 16, 2014 (8 pages).

Japanese Patent Office, "Office Action," issued in connection with Japanese Patent Application No. 2018-218076, dated Nov. 10, 2020 (7 pages).

* cited by examiner

CHALCOGENIDE MEMORY DEVICE COMPONENTS AND COMPOSITION

CROSS REFERENCE

The present Application for Patent is a continuation of U.S. patent application Ser. No. 16/184,465 by Fantini et al., entitled "Chalcogenide Memory Device Components and Composition," filed Nov. 8, 2018, which is a divisional of and claims priority to and the benefit of U.S. patent application Ser. No. 15/466,689 by Fantini et al., entitled "Chalcogenide Memory Device Components and Composition," filed Mar. 22, 2017, assigned to the assignee hereof, and each of which is expressly incorporated by reference in its entirety herein.

BACKGROUND

The following relates generally to memory devices and more specifically to chalcogenide memory device components and chemistry.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

Chalcogenide material compositions may be used in components or elements of PCM devices. These compositions may have a threshold voltage at which they become conductive (i.e. they switch on to allow current flow). The threshold voltage may change over time, which may be referred to as drift. Compositions that have a higher tendency for voltage drift may limit the usefulness and performance of devices employing those compositions.

DETAILED DESCRIPTION

Figure 1:
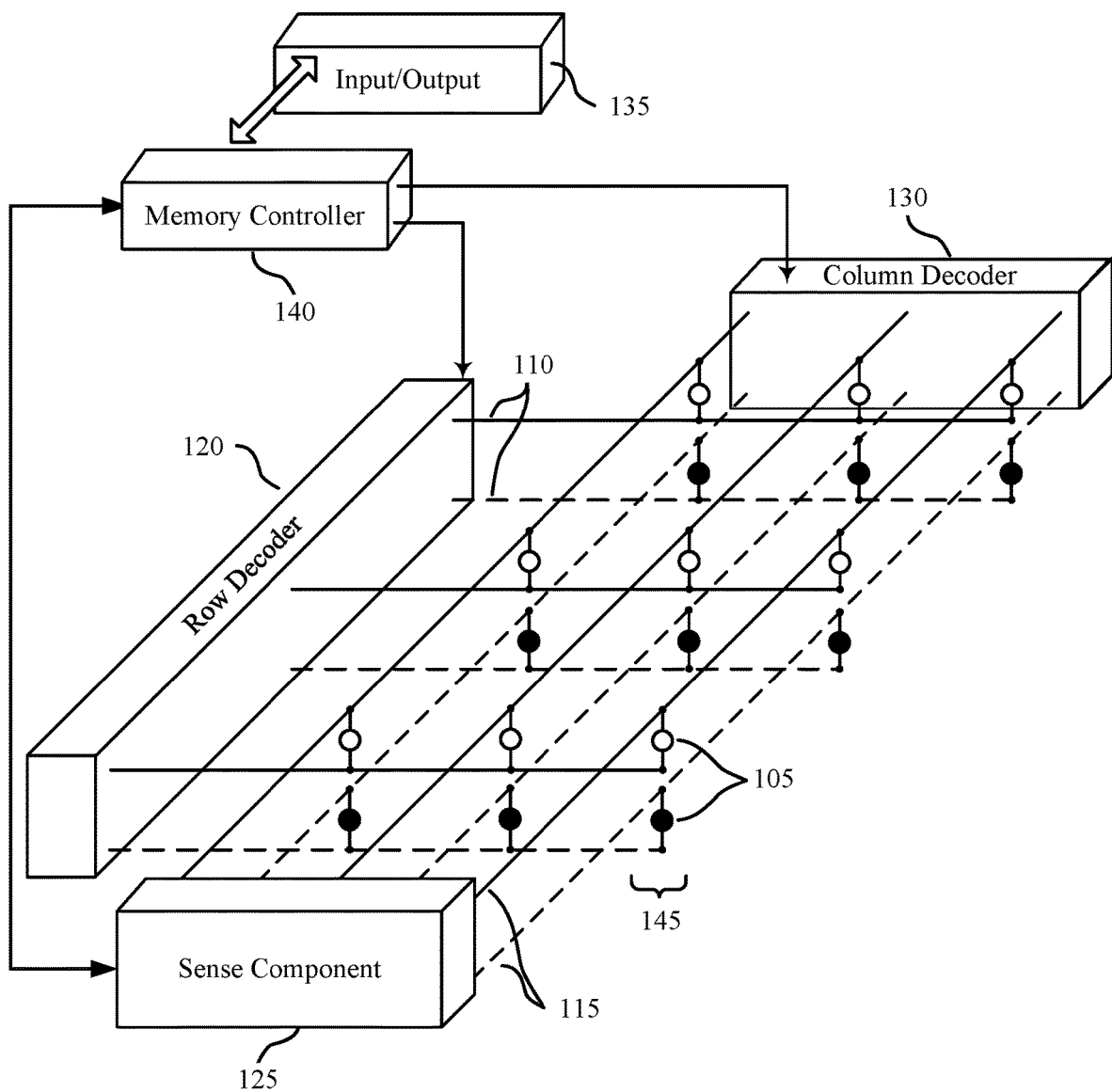
FIG. 1 illustrates an example of a memory array that supports or employs chalcogenide memory device components in accordance with embodiments of the present disclosure.

The effects of voltage drift in a selector device of a memory cell may be mitigated by introducing an element into the composition of the selector device that increases stability. For example, an element from Group III of the periodic table (also referred to as the Boron Group and Group 13) may stabilize or limit the voltage drift the selector device relative to compositions that do not include such elements. Group III (or Boron Group) elements include boron (B), aluminum (Al), gallium (Ga), indium (In), and thallium (Tl).

By way of example, a chalcogenide material composition for a selector device (or other memory element) may include selenium (Se), arsenic (As), and germanium (Ge). This combination or elements may be referred to as SAG. Within a memory cell, which may include a memory storage element and a selector device, a chalcogenide composition or chalcogenide material may be used for either the memory storage element or the selector device, or both. The selector device may have a SAG composition, which may have a stable threshold voltage and relatively desirable leakage properties. In some cases, Silicon (Si) may be introduced into the SAG composition to enhance the thermal stability of the selector device without compromising the drift and the threshold voltage leakage. However, the implementation of Si into the SAG system may not improve the drift enough to be able to scale the technology.

A higher concentration of Ge in the selector device may increase the threshold voltage and compromise the selector device stability. For example, Ge atoms may transition from a pyramidal bond configuration to a tetrahedral bond configuration. This transition may promote a widening of the band gap and may increase the threshold voltage of the selector device.

As described herein, a Group III element may be introduced into the chalcogenide material composition to limit the presence of Ge in the selector device. For example, a Group III element may replace some or all of the Ge in the composition of the selector device. In some cases, a Group III element may form a stable, Group III element-centered tetrahedral bond structure with the preexisting elements (i.e. Se, As, and/or Si). Incorporating a Group III element into the chalcogenide material composition may stabilize the selector device to allow for technology scaling and increased cross point technology development (e.g., three-dimensional cross point architectures, RAM deployments, storage deployments, or the like).

Features and techniques introduced above are further described below in the context of a memory array. Specific examples are then described for chalcogenide memory device components and compositions that provide for lower voltage drift relative to other devices or compositions. These and other features of the disclosure are further illustrated by and described with reference to apparatus diagrams, system diagrams, and flowcharts that relate to reading or writing non-volatile memory cells.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted a logic 0 and a logic 1. In some cases, memory cell 105 is configured to store more than two logic states. A memory cell 105 may store charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below. Or in some cases, chalcogenide-based and/or PCM may be employed. Chalcogenides described herein may be used for PCM memory storage elements or selector devices or both.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145. Memory array 100 may include a composition of Se, As, Ge, Si, B, Al, Ga, In, or Tl, or some combination of these elements.

Each row of memory cells 105 is connected to an access line 110, and each column of memory cells 105 is connected to a bit line 115. Access lines 110 may also be known as word lines 110, and bit lines 115 may also be known digit lines 115. References to word lines and bit lines, or their analogues, are interchangeable without loss of understanding or operation. Word lines 110 and bit lines 115 may be substantially perpendicular to one another to create an array. The two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible, for example, a third layer may share a word line 110 with a lower layer.

In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively doped semiconductors, or other conductive materials, alloys, or compounds. Upon selecting a memory cell 105, the resulting signal may be used to determine the stored logic state. For example, a voltage may be applied and the resulting current may be used to differentiate between the resistive states of the phase change material. A cell 105 may be selected when a selector device is biased. The selection of cell 105 may be a function of the threshold voltage of the selector device, which, in turn, may have a more predictable value when the selector device has a composition that includes a Group III element. That this, the voltage drift of a selector device of a cell 105 may be less if the selector device has a composition that includes a Group III element than if the selector device has a purely SAG composition or a Si-SAG composition.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and bit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may connected to or in electronic communication with column decoder 130 or row decoder 120.

A memory cell 105 may be set, or written, by similarly activating the relevant word line 110 and bit line 115—i.e., a logic value may be stored in the memory cell 105. Column decoder 130 or row decoder 120 may accept data, for example input/output 135, to be written to the memory cells 105. In the case of phase change memory, a memory cell 105 is written by heating the memory element, for example, by passing a current through the memory element. This process is discussed in more detail below.

Memory cells 105 may each have a memory element and a selector device, wherein each selector device comprises a chalcogenide material having a composition of selenium, arsenic, and at least one of B, Al, Ga, In, and Tl. In some cases, the composition of the chalcogenide material comprises germanium or silicon, or both.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as chalcogenide-based or PCM, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile chalcogenide-based or PCM cells may have beneficial properties that may result in improved performance relative to other memory architectures. For example, chalcogenide-based or PCM may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltage potentials or currents used during the operation of memory array 100. For example, it may apply discharge voltages to a word line 110 or bit line 115 after accessing one or more memory cells 105.

In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state. The reliability with which the memory controller 140 may access cells 105 may increase as the threshold voltage drift of a selector device for each cell 105 decreases because the voltage necessary to access the cell 105 may remain relatively constant over the life of the cell 105.

Figure 2:
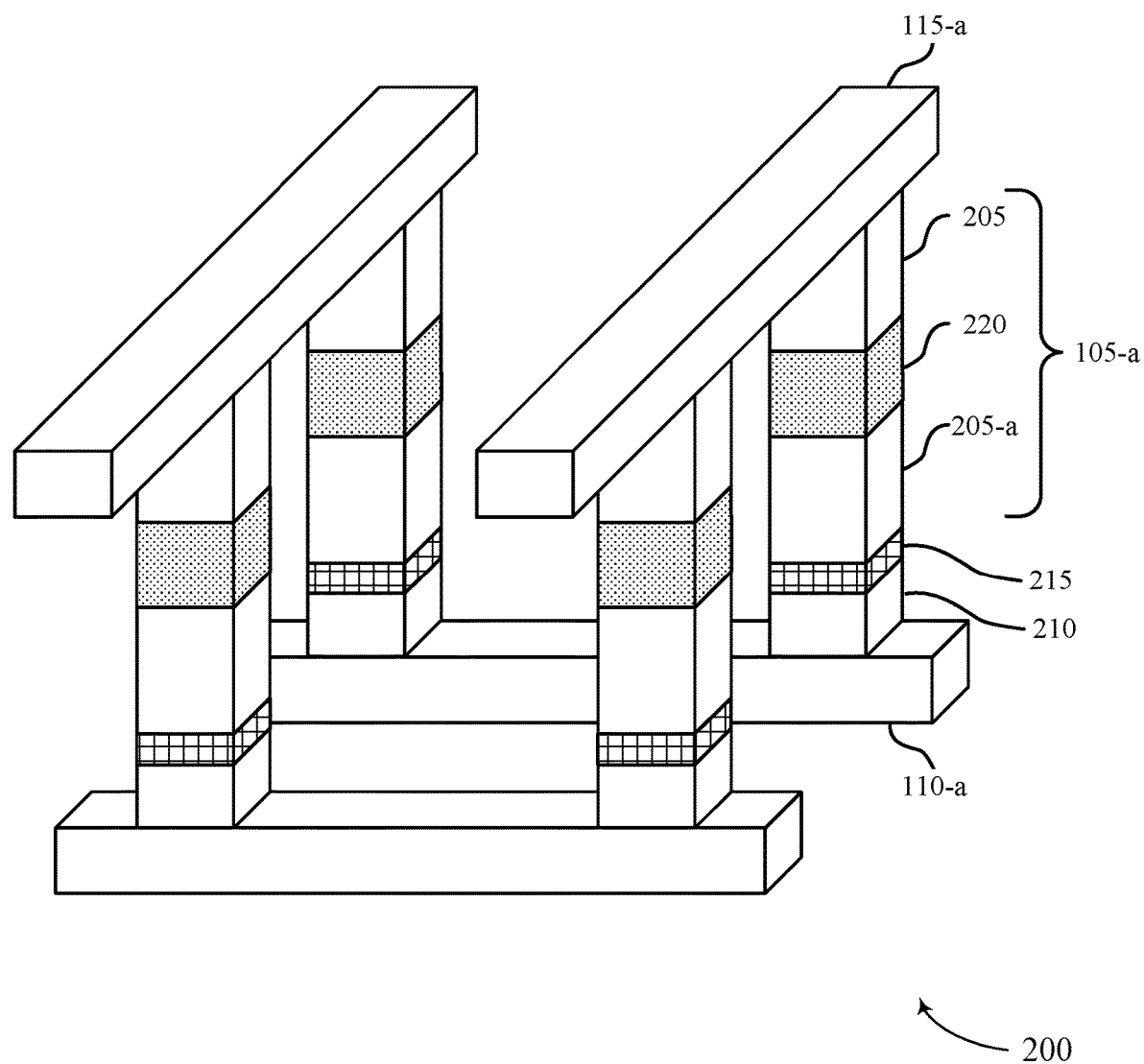
FIG. 2 illustrates an example memory array that supports or employs chalcogenide memory device components in accordance with embodiments of the present disclosure.

FIG. 2 illustrates an example memory array 200 that supports chalcogenide memory device components and compositions in accordance with various embodiments of the present disclosure. Memory array 200 may be an example of memory array 100 described with reference to FIG. 1.

Memory array 200 includes memory cell 105-*a*, first access line 110-*a* (e.g. word line 110-*a*), and second access line 115-*a* (e.g. bit line 115-*a*), which may be examples of a memory cell 105, word line 110, and bit line 115, as described with reference to FIG. 1. Memory cell 105-*a* includes electrode 205, electrode 205-*a*, and memory element 220, which may be a ferroelectric material. Electrode 205-*a* of memory cell 105-*a* may be referred to as middle electrode 205-*a*. Memory array 200 may also include bottom electrode 210 and selector device 215, which may also be referred to as a selection component. In some cases, a three-dimensional (3D) memory array may be formed by stacking multiple memory arrays 200 on one another. The two stacked arrays may, in some examples, have common conductive lines such that each level may share word lines 110 or bit lines 115 as described with reference to FIG. 1. Memory cell 105-*a* may be a target memory cell.

Memory array 200 may be referred to as a cross-point architecture. It may also be referred to as a pillar structure. For example, as shown in FIG. 2, a pillar may be in contact with a first conductive line (first access line 110-*a*) and a second conductive line (second access line 115-*a*), where the pillar comprises a first electrode (bottom electrode 210), selector device 215, and ferroelectric memory cell 105-*a*, where ferroelectric memory cell 105-*a* includes a second electrode (electrode 205-*a*), memory element 220, and a third electrode (electrode 205). In some cases, electrode 205-*a* may be referred to as a middle electrode. In some cases, the first access line 110-*a* may be in electronic communication with the second access line 115-*a* via the memory cell 105-*a*. First access line 110-*a* and second access line 115-*a* may be arranged in a three-dimensional cross-point configuration and may be in electronic communication with the plurality of memory cells 105-*a*.

Such a pillar architecture may offer relatively high-density data storage with lower production costs compared to other memory architectures. For example, the cross-point architecture may have memory cells with a reduced area and, resultantly, an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

Selector device 215 may, in some cases, be connected in series between a memory cell 105 and a conductive line, for example, between memory cell 105-*a* and at least one of first access line 110-*a* or second access line 115-*a*. For example, as depicted in FIG. 2, selector device 215 may be located between electrode 205-*a* and bottom electrode 210; thus, selector device 215 is located in series between memory cell 105-*a* and first access line 110-*a*. Other configurations are possible. For example, selector device 215 may be located in series between memory cell 105-a and second access line 115-a. The selection component may aid in selecting a particular memory cell 105-a or may help prevent stray currents from flowing through non-selected memory cells 105-a adjacent a selected memory cell 105-a. For example, selector device 215 may have a threshold voltage such that a current flows through selector device 215 when the threshold voltage is met or exceeded.

Selector device 215 may be coupled with the memory element 220. The selector device 215 and the memory element 220 may be arranged in a series configuration between the first access line 110-a and the second access line 115-a. A selector device 215 may include a first chalcogenide material comprising a composition of Se, As, and at least one of B, Al, Ga, In, and Tl. In some cases, a selector device 215 may comprise a first chalcogenide material and a memory element 220 may comprise a different composition (e.g., a second chalcogenide material) than the selector device 215. Although not shown, in some cases, a cell 105 may not use a separate memory element and selector device. This type of memory architecture may be referred to as self-selecting memory (SSM), and the selector device 215 may serve as the memory storage element. A memory device may therefore include a memory cell that comprises a self-selecting memory device. For example, a single element that includes a chalcogenide material may serve as both a memory element and a selector device such that a separate selector device may be unncessary. In some cases, the memory element 220 may comprise a ferroelectric capacitor or a memristor rather than a phase change material.

Selector device 215 may be separated from memory element 220 by middle electrode 205-a. As such, middle electrode 205-a may electrically float—that is, charge may accumulate because it may not be directly connected to an electrical ground or a component capable of being electrically grounded. Memory element 220 may be accessed via selector device 215. For example, when a voltage across selector device 215 reaches a threshold value, current may flow between access lines 110-a and 115-a through memory element 220. This flow of current may be used to read a logic value stored at memory element 220. The threshold voltage across selector device 215 at which current begins to flow may be a function of the composition of selector device 215. Likewise, the composition of selector device 215 may affect whether and the extent to which the threshold voltage of selector device 215 may change over time.

As discussed elsewhere herein, a change in threshold voltage over time may be referred to as a threshold voltage drift. Threshold voltage drift may be undesirable because as the threshold voltage of a selector device changes, the operation (e.g., the application of voltage necessary to cause current to flow through the selector device) may change. This may complicate reading or writing of the device, may lead to inaccurate reading or writing, may cause increases in power necessary to read or write to a memory element, and the like. So as described herein, employing compositions of matter for selector device 215 that limit the likelihood or extent of threshold voltage drift may serve to improve device performance. Selector device 215 may thus comprise a composition that includes one or more Group III elements, which, as discussed below, may limit threshold voltage drift.

Memory array 200 may be made by various combinations of material formation and removal. For example, layers of material may be deposited that correspond to the first access line 110-a, bottom electrode 210, selector device 215, electrode 205-a, memory element 220, and electrode 205. Material may be selectively removed to then create the desired features, such as the pillar structure depicted in FIG. 2. For example, features may be defined using photolithography to pattern a photoresist and then material may be removed by techniques such as etching. Second access lines 115-a may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Figure 3:
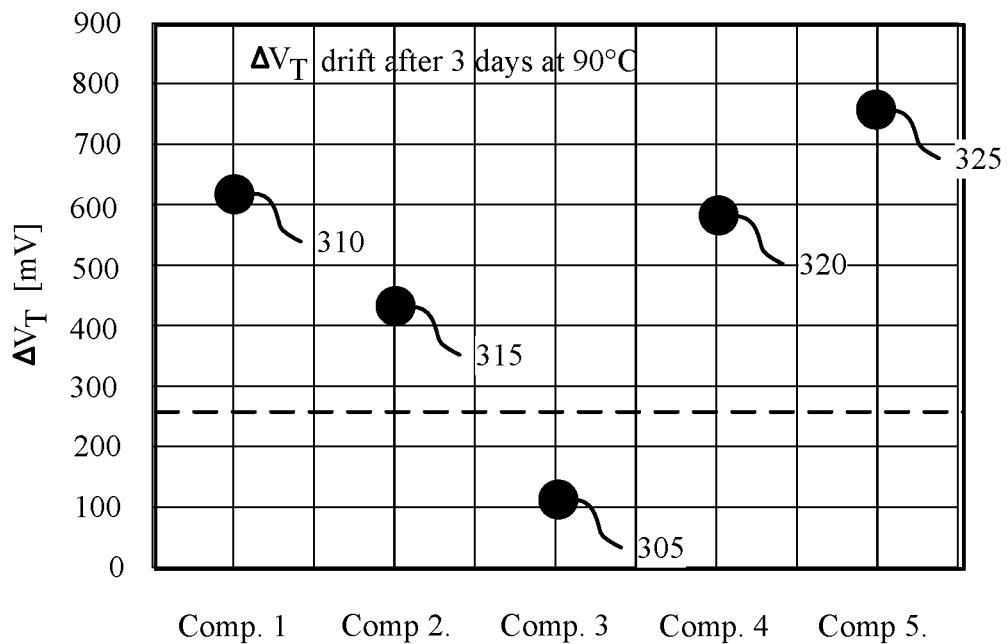
FIG. 3 illustrates a plot of characteristics of chalcogenide memory device components and compositions in accordance with embodiments of the present disclosure.

FIG. 3 illustrates a plot 300 of characteristics of chalcogenide memory device components and compositions in accordance with embodiments of the present disclosure. As described herein, FIG. 3 depicts a comparison of chalcogenide material compositions, including a composition that includes a Group III element. FIG. 3 thus illustrates the relatively lower voltage drift of a composition of Se, As, and a Group III element, which is depicted as composition 3 (Comp. 3).

By way of example, composition 3 may be approximately 53% Se by weight, approximately 23% As by weight, approximately 13% Ge by weight, and approximately 11% In by weight, relative to the total weight of the composition. Composition 3 at point 305 may have a voltage drift of less than 250 millivolts after 3 days at 90 degrees Celsius.

The voltage drift of composition 3 may allow for improved performance of the selector device because there may be less total voltage drift over a period of time. Thus, the addition of In (or another Group III element) into the chalcogenide composition may result in minimizing the voltage drift when compared to other chalcogenide material compositions. For example, compositions 1 and 2 may be pure SAG compositions (i.e. including only Se, As, Ge). Compositions 4 and 5 may be pure Si-SAG alloys (i.e. including only Se, As, Ge, Si). In some examples, compositions 4 and 5 may have the amount of approximately 30% As by weight, approximately 12% Ge by weight, and approximately 8% Si by weight, relative to the total weight of the composition. In some cases, the chalcogenide material compositions (i.e. composition 1 at point 310, composition 2 at point 315, composition 4 at point 320, composition 5 at point 325) may drift more than 500 millivolts after 3 days at 90 degrees Celsius.

As described herein, the addition of In (or another Group III element) into the chalcogenide mixture may increase the stability of the selector device. A chalcogenide material composition (e.g. composition 3) may yield results identified in TABLE 1.

TABLE 1

| Vth_FF [V] | Vth_SF [V] | Vform [V] | Vth_1000 [V] | I @ 0.85 Vt (@ 1e3) [nA] | STDrift [mV/dec] WT ≤ 1 s |
|---|---|---|---|---|---|
| 5.00 | 4.77 | 0.06 | 4.25 | 35 | 0 |

As shown in TABLE 1, the Vth_FF and Vth_SF column headings may represent the threshold voltage read at the first activation (i.e., a "first fire") and a subsequent activation (i.e., "second fire") of a selector device having composition 3, respectively. The Vform column heading may represent the threshold voltage difference between the first fire and the second fire. In some examples, the Vth_1000 column heading may represent the threshold voltage after 1000 cycles. The I @ 0.84 Vt column heading may represent the sub threshold voltage leakage current in the selector device. The STDrift column heading may represent the drift of the selector device. So as shown in Table 3, a chalcogenide composition that include In or another Group III element (e.g. composition 3) may result in stable threshold voltages during cycling and a low drift over a period of time.

Figure 4:
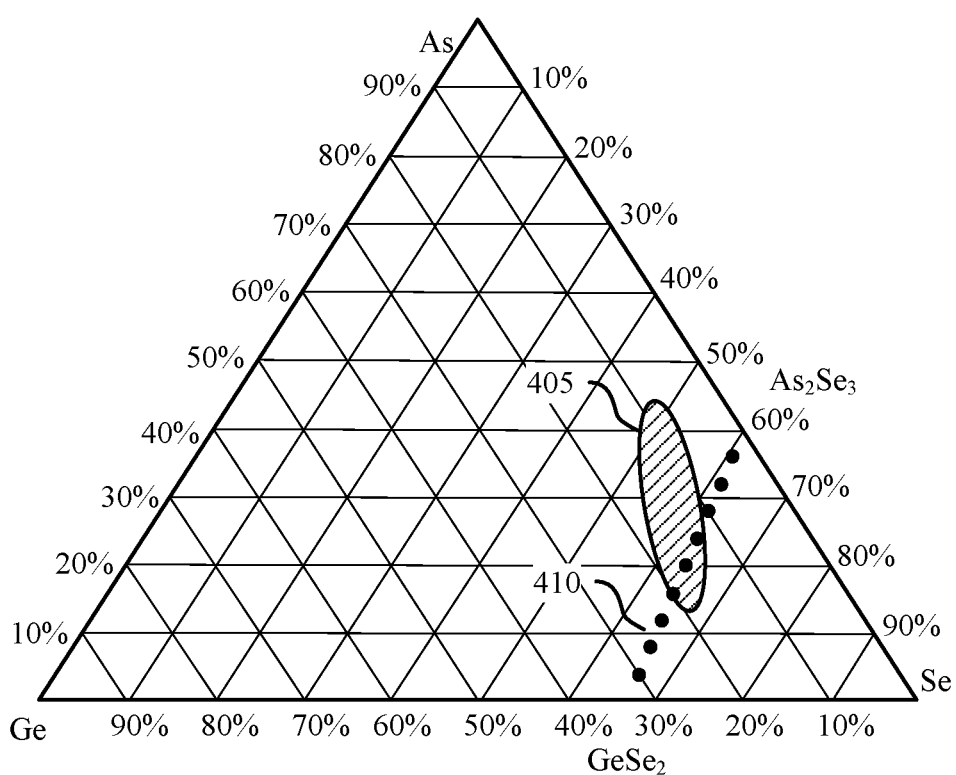
FIG. 4 illustrates a plot of characteristics of chalcogenide memory device components and compositions in accordance with embodiments of the present disclosure.

FIG. 4 illustrates a plot 400 of characteristics of chalcogenide memory device components and compositions in accordance with embodiments of the present disclosure. For example, region 405 illustrates compositions of Se, As, and Ge that may be doped with a Group III element. Dotted line 410 illustrates the $As_2Se_3$—$GeSe_2$ composition line. As described herein, compositions with low voltage drift may be useful for selector devices or other memory elements and may include some combination of Se, As, Ge, Si, or Group III elements. A chalcogenide material composition may result in the general formula $Se_xAs_yGe_zSi_wX_u$, where X is one of the Group III elements. For example, a chalcogenide material composition may result in the formula $Se_4As_2GeSiIn$, where In is one of the Group III elements. In other examples, a chalcogenide material composition may result in the formula $Se_3As_2GeSi_2B$, where B is one of the Group III elements. Chalcogenide material compositions may be comprised of the compositions identified in TABLE 2, which may provide composition ranges by weight percentages of Se, As, Ge, Si, and a Group III element.

TABLE 2

|  | Se | As | Ge | Si | group III element |
|---|---|---|---|---|---|
| First (%) | >40 | 10-35 | 1-20 | 1-15 | 0.15-35 |
| Second (%) | >45 | 12-32 | 1-20 | 1-15 | 0.15-24 |

In some cases, Se may be in an amount greater than or equal to 40% by weight, relative to a total weight of the composition. In some cases, the amount of Se may be greater than or equal to 45% by weight, relative to the total weight of the composition. Arsenic may be in an amount ranging from 10% to 35% by weight, relative to the total weight of the composition. In some cases, the amount of As ranges from 12% to 32% by weight, relative to the total weight of the composition. In some examples, Ge may be in an amount ranging from 1% to 20% by weight, relative to the total weight of the composition.

In some examples, Si may be in an amount ranging from 1% to 15% by weight, relative to the total weight of the composition. The combination of Si, Ge, and at least one element selected from the group consisting of B, Al, Ga, In, and Tl may be an amount greater than or equal to 20% by weight, relative to the total weight of the composition.

A Group III element may be at least one element selected from a group consisting of B, Al, Ga, In, and Tl in an amount ranging from 0.15% to 35% by weight, relative to the total weight of the composition. In some cases, the at least one element selected from the group consisting of B, Al, Ga, In, and Tl in an amount ranging from 0.15% to 24% by weight, relative to the total weight of the composition.

The chalcogenide material compositions of TABLE 2 may have a threshold voltage drift of less than or equal to 250 millivolts after three days at a temperature of 90 degrees Celsius. In some examples, the chalcogenide material compositions of TABLE 2 may have the glass transition temperature greater than 280 degrees Celsius. Glass transition temperature and glass processing conditions may have an impact upon a composition selection within the ranges provided by TABLE 2.

As described herein, a Group III element may be incorporated into a composition of matter, such as a composition of Se and As or SAG or Si-SAG to mitigate various problems associated with the selector device have pure SAG or Si-SAG compositions. In some cases, too little Ge may compromise the thermal stability of the chalcogenide material composition. On the other hand, a SAG system with a Ge composition greater than 15% may be too thermally unstable to be integrated into cross-point arrays. In some examples, a high composition of Se may result in a high band gap energy that may sustain a high threshold voltage and leakage trade off.

As mentioned above, a Group III element may increase selector device stability through the formation of strong and stable bonds. In some examples, Group III elements may form tetrahedral bonds that may not degrade drift. A lower voltage drift, as depicted in FIG. 3, may be directly related to the bond structure. For example, the Al—Se bond dissociation energy may be 318 kJ mol−1, and the In—Se bond dissociation energy may be 245 kJ mol−1. A higher bond dissociation energy may correlate to a stronger and more stable bond.

A Group III element may also provide increased thermal stability in the selector device. For example, $Al_2Se_3$ may have a band gap energy of 3.1 eV, and $In_2Se_3$ may have a band gap energy of 2.1 eV. A wider band gap may increase the threshold voltage over time and may allow the selector device to operate at higher temperatures. For example, $Al_2Se_3$ may have a melting temperature of 1220 K, and $In_2Se_3$ may have a melting temperature of 933 K. A high melting temperature may increase the thermal stability of the selector device. In some examples, the transition temperature of the chalcogenide material composition may also increase.

As described herein, the addition of a Group III element to chalcogenide material composition in the selector device may provide additional benefits. For example, the introduction of B into a selector device may serve as an insulator. Therefore, a selector device comprising a B-SAG system may prevent leakage issues. In some examples, introduction of Al may facilitate integration into cross-point arrays. In other examples, introduction of In may minimize voltage drift. Introduction of a group III element (e.g. B, Al, Ga, In, Tl) into the chalcogenide material composition may increase selector device stability.

Figure 5:
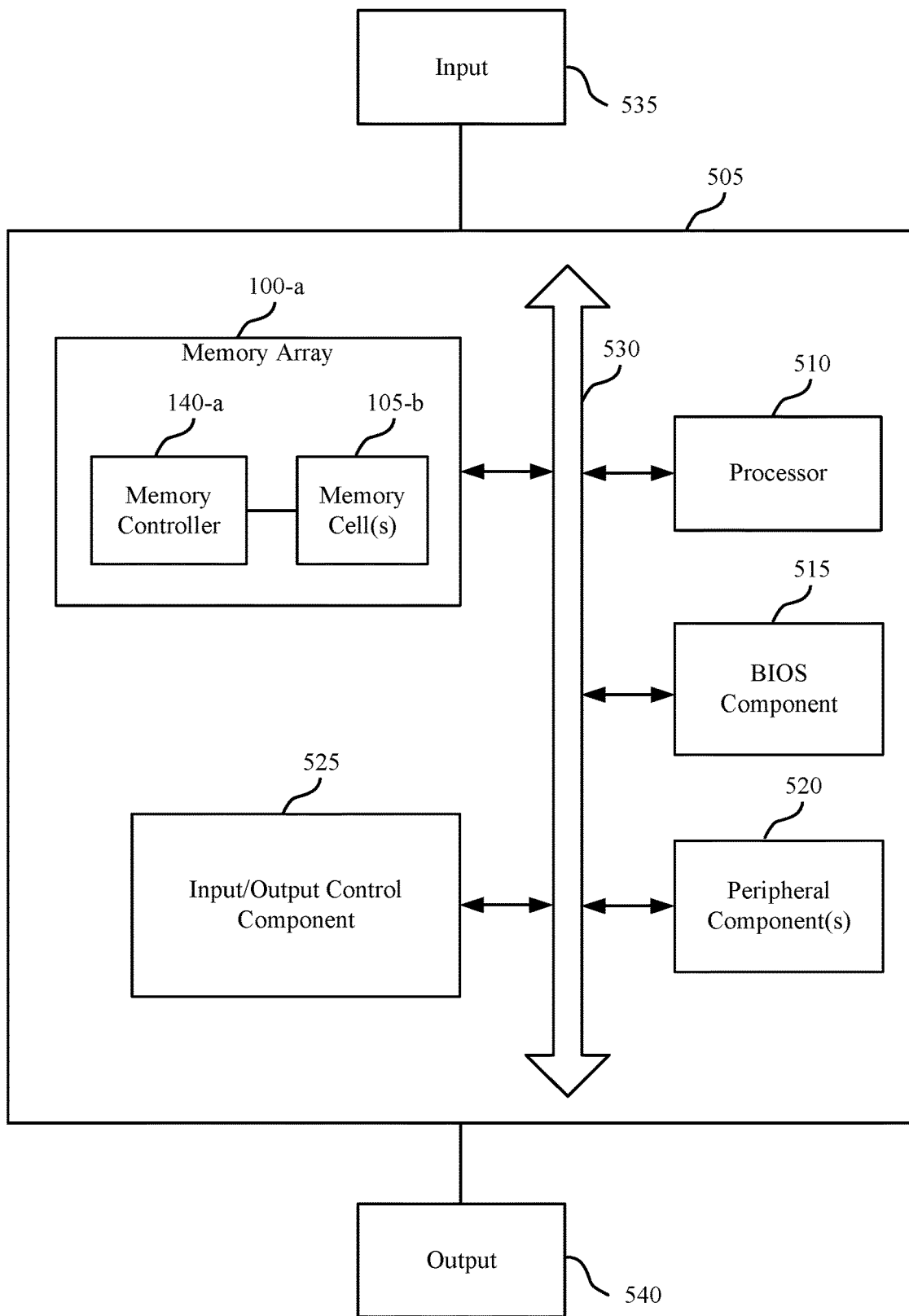
FIG. 5 illustrates a system, including a memory array, that supports or employs chalcogenide memory device components in accordance with embodiments of the present disclosure.

FIG. 5 illustrates a system 500, including a memory array, that supports or employs chalcogenide memory device components in accordance with embodiments of the present disclosure. System 500 may include a device 505, which may be or include a printed circuit board to connect or physically support various components. Device 505 may include a memory array 100-a, which may be an example of memory array 100 described in FIG. 1. Memory array 100-a may contain memory controller 140-a and memory cell(s) 105-b, which may be examples of memory controller 140 described with reference to FIG. 1 and memory cells 105 described with reference to FIGS. 1 and 2.

Memory array 100-a may include a plurality of memory cells 105-a each having a memory element and a selector device, and each selector device may comprise a chalcogenide material having a composition of selenium, arsenic, and at least one of boron, aluminum, gallium, indium, or thallium. In some examples, the composition of the chalcogenide material comprises germanium or silicon, or both. In some cases, composition of the chalcogenide material comprises a combination of the silicon, the germanium, and the at least one of the boron, aluminum, gallium, indium, or thallium in an amount greater than or equal to 20% by weight, relative to a total weight of the composition. Memory array 100-a may also include a plurality of access lines arranged in a three-dimensional cross-point configuration and in electronic communication with the plurality of memory cells 105-a.

Device 505 may also include a processor 510, BIOS component 515, peripheral component(s) 520, and input/output control component 525. The components of device 505 may be in electronic communication with one another through bus 530.

Processor 510 may be configured to operate memory array 100-a through memory controller 140-a. In some cases, processor 510 performs the functions of memory controller 140 described with reference to FIG. 1. In other cases, memory controller 140-a may be integrated into processor 510. Processor 510 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 510 may perform various functions described herein. Processor 510 may, for example, be configured to execute computer-readable instructions stored in memory array 100-a to cause device 505 perform various functions or tasks.

BIOS component 515 may be a software component that includes a basic input/output system (BIOS) operated as firmware, which may initialize and run various hardware components of system 500. BIOS component 515 may also manage data flow between processor 510 and the various components, e.g., peripheral components 520, input/output control component 525, etc. BIOS component 515 may include a program or software stored in read-only memory (ROM), flash memory, or any other non-volatile memory.

Peripheral component(s) 520 may be any input or output device, or an interface for such devices, that is integrated into device 505. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 525 may manage data communication between processor 510 and peripheral component(s) 520, input 535 devices, or output 540 devices. Input/output control component 525 may also manage peripherals not integrated into device 505. In some cases, input/output control component 525 may represent a physical connection or port to the external peripheral.

Input 535 may represent a device or signal external to device 505 that provides input to device 505 or its components. This may include a user interface or interface with or between other devices. In some cases, input 535 may be a peripheral that interfaces with device 505 via peripheral component(s) 520 or may be managed by input/output control component 525.

Output 540 may represent a device or signal external to device 505 configured to receive output from device 505 or any of its components. Examples of output 540 may include data or signals sent to a display, audio speakers, a printing device, another processor or printed circuit board, etc. In some cases, output 540 may be a peripheral that interfaces with device 505 via peripheral component(s) 520 or may be managed by input/output control component 525.

The components of memory controller 140-a, device 505, and memory array 100-a may be made up of circuitry designed to carry out their functions. This may include various circuit elements, for example, conductive lines, transistors, capacitors, inductors, resistors, amplifiers, or other active or inactive elements, configured to carry out the functions described herein.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

As used herein, 'coupled to' indicates components that are substantially in contact with one another. In some cases, two components may be coupled even if a third material or component physically separates them. This third component may not substantially alter the two components or their functions. Instead, this third component may aid or enable the connection of the first two components. For example, some materials may not strongly adhere when deposited on a substrate material. Thin (e.g., on the order of a few nanometers or less) layers, such as lamina layers, may be used between two materials to enhance their formation or connection. In other cases, a third material may act as a buffer to chemically isolate two components.

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 100, may be formed on a semiconductor substrate, such as silicon (Si), germanium, silicon-germanium alloy, gallium arsenide (GaAs), gallium nitride (GaN), etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means. A portion or cut of a substrate containing a memory array or circuit may be referred to as a die.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt.

The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A composition of matter, comprising:
    silicon, wherein the silicon is in an amount ranging from 1% to 10% by weight, relative to a total weight of the composition;
    germanium; and
    at least one element selected from a group of consisting of boron, aluminum, gallium, indium, and thallium, wherein a combination of the silicon, the germanium, and the at least one element selected from the group consisting of boron, aluminum, gallium, indium, and thallium is in an amount greater than or equal to 20% by weight, relative to the total weight of the composition, wherein the at least one element selected from the group consisting of boron, aluminum, gallium, indium, and thallium is in an amount ranging from 0.15% to 12% by weight, relative to the total weight of the composition.

2. The composition of claim 1, further comprising selenium.

3. The composition of claim 2, further comprising arsenic.

4. The composition of claim 3, wherein the arsenic is in an amount ranging from 10% to 35% by weight, relative to the total weight of the composition.

5. The composition of claim 1, wherein the at least one element selected from the group consisting of boron, aluminum, gallium, indium, and thallium is in an amount greater than or equal to 1% by weight, relative to the total weight of the composition.

6. The composition of claim 1, wherein the germanium is in an amount ranging from 8% to 20% by weight, relative to the total weight of the composition.

7. A composition of matter, comprising:
    silicon:
    germanium;
    selenium, wherein the selenium is in an amount greater than or equal to 40% by weight, relative to a total weight of the composition; and
    at least one element selected from a group of consisting of boron, aluminum, gallium, indium, and thallium, wherein a combination of the silicon, the germanium, and the at least one element selected from the group consisting of boron, aluminum, gallium, indium, and thallium is in an amount greater than or equal to 20% by weight, relative to the total weight of the composition, wherein the at least one element selected from the group consisting of boron, aluminum, gallium, indium, and thallium is in an amount ranging from 0.15% to 12% by weight, relative to the total weight of the composition.

8. A composition of matter, comprising:
    selenium, wherein the selenium is in an amount greater than or equal to 40% by weight, relative to a total weight of the composition;
    silicon; and
    at least one element selected from a group consisting of boron, aluminum, gallium, indium, and thallium in an amount ranging from 0.15% to 12% by weight, relative to the total weight of the composition.

9. The composition of claim 8, wherein the selenium is in an amount greater than or equal to 45% by weight, relative to the total weight of the composition.

10. The composition of claim 8, further comprising:
    germanium, wherein a combination of the silicon, the germanium, and the at least one element selected from the group consisting of boron, aluminum, gallium, indium, and thallium is in an amount greater than or equal to 20% by weight, relative to the total weight of the composition.

11. A composition of matter, comprising:
    selenium:
    silicon, wherein the silicon is in an amount ranging from 1% to 15% by weight, relative to a total weight of the composition; and at least one element selected from a group consisting of boron, aluminum, gallium, indium, and thallium in an amount ranging from 0.15% to 12% by weight, relative to the total weight of the composition.

12. A composition of matter, comprising:
selenium;
silicon;
arsenic, wherein the arsenic is in an amount ranging from 10% to 35% by weight, relative to a total weight of the composition; and
at least one element selected from a group consisting of boron, aluminum, gallium, indium, and thallium in an amount ranging from 0.15% to 12% by weight, relative to the total weight of the composition.

13. A composition of matter, comprising:
selenium, wherein the selenium is in an amount greater than or equal to 40% by weight, relative to a total weight of the composition;
arsenic; and
at least one element selected from a group consisting of boron, aluminum, gallium, and indium in an amount ranging from 0.15% to 12% by weight, relative to the total weight of the composition.

14. The composition of claim 13, further comprising silicon.

15. A composition of matter, comprising:
selenium;
arsenic;
germanium, wherein the germanium is in an amount ranging from 1% to 20% by weight, relative to a total weight of the composition; and
at least one element selected from a group consisting of boron, aluminum, gallium, and indium in an amount ranging from 0.15% to 12% by weight, relative to the total weight of the composition.

16. A composition of matter, comprising:
selenium;
arsenic, wherein the arsenic is in an amount ranging from 10% to 35% by weight, relative to a total weight of the composition; and
at least one element selected from a group consisting of boron, aluminum, gallium, and indium in an amount ranging from 0.15% to 12% by weight, relative to the total weight of the composition.

* * * * *